United States Patent
Horger et al.

(10) Patent No.: US 10,120,047 B2
(45) Date of Patent: Nov. 6, 2018

(54) METHOD AND MAGNETIC RESONANCE APPARATUS FOR PERFORMING AN ADJUSTING MEASUREMENT

(71) Applicant: Siemens Aktiengesellschaft, Munich (DE)

(72) Inventors: Wilhelm Horger, Schwaig (DE); Michael Koehler, Nuremberg (DE); Dieter Ritter, Fuerth (DE); Michael Wullenweber, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 448 days.

(21) Appl. No.: 14/832,120

(22) Filed: Aug. 21, 2015

(65) Prior Publication Data
US 2016/0054408 A1    Feb. 25, 2016

(30) Foreign Application Priority Data
Aug. 21, 2014    (DE) .................. 10 2014 216 612

(51) Int. Cl.
| | |
|---|---|
| *G01V 3/00* | (2006.01) |
| *G01R 33/3875* | (2006.01) |
| *G01R 33/36* | (2006.01) |
| *G01R 33/54* | (2006.01) |
| *G01R 33/483* | (2006.01) |
| *G01R 33/565* | (2006.01) |
| *G01R 33/58* | (2006.01) |

(52) U.S. Cl.
CPC ......... *G01R 33/3875* (2013.01); *G01R 33/36* (2013.01); *G01R 33/483* (2013.01); *G01R 33/543* (2013.01); *G01R 33/5659* (2013.01); *G01R 33/583* (2013.01)

(58) Field of Classification Search
USPC .......................................... 324/309
See application file for complete search history.

(56) References Cited

U.S. PATENT DOCUMENTS

| | | | | |
|---|---|---|---|---|
| 6,064,208 A * | 5/2000 | Steckner | ............ | G01R 33/3875 324/300 |
| 8,295,934 B2 * | 10/2012 | Leyde | ................ | A61N 1/36082 607/2 |

(Continued)

OTHER PUBLICATIONS

Katscher et al., "Transmit Sense", Magnetic Resonance in Medicine vol. 49, pp. 144 150; (2003).

(Continued)

*Primary Examiner* — Rodney Fuller
(74) *Attorney, Agent, or Firm* — Schiff Hardin LLP

(57) ABSTRACT

In a method and magnetic resonance apparatus for performing at least one adjusting measurement for the magnetic resonance apparatus, a localizing measurement is performed using the magnetic resonance apparatus and a localization dataset is created, and at least one examination region on the localization dataset. At least one examination region of the localization dataset is selected, and at least one adjusting measurement is performed according to the at least one selected examination region. The at least one adjusting measurement can be the calculation of a radio-frequency pulse amplitude, the calculation of a system frequency and the calculation of at least one current of at least one shim coil.

9 Claims, 2 Drawing Sheets

(56) References Cited

U.S. PATENT DOCUMENTS

| | | | | |
|---|---|---|---|---|
| 9,280,718 B2* | 3/2016 | Claude | ............... | A61B 5/055 |
| 9,808,177 B2* | 11/2017 | Claude | ............... | A61B 5/055 |
| 2007/0132455 A1* | 6/2007 | Rapoport | ........... | G01R 33/3875 |
| | | | | 324/320 |
| 2008/0116889 A1* | 5/2008 | Hu | ................... | G01R 33/46 |
| | | | | 324/309 |
| 2010/0254584 A1* | 10/2010 | Gulsun | ............... | A61B 5/055 |
| | | | | 382/131 |
| 2014/0327440 A1* | 11/2014 | Nakanishi | ............ | A61B 5/055 |
| | | | | 324/309 |

OTHER PUBLICATIONS

Schär, et al.:"Simultaneous B0- and B1+-map Acquisition for fast Localized Shim, Frequency and RF Power Determination in the Heart at 3T"; in: Magn Reson Med.; vol. 63; No. 2; pp. 419-426 (2010).

* cited by examiner

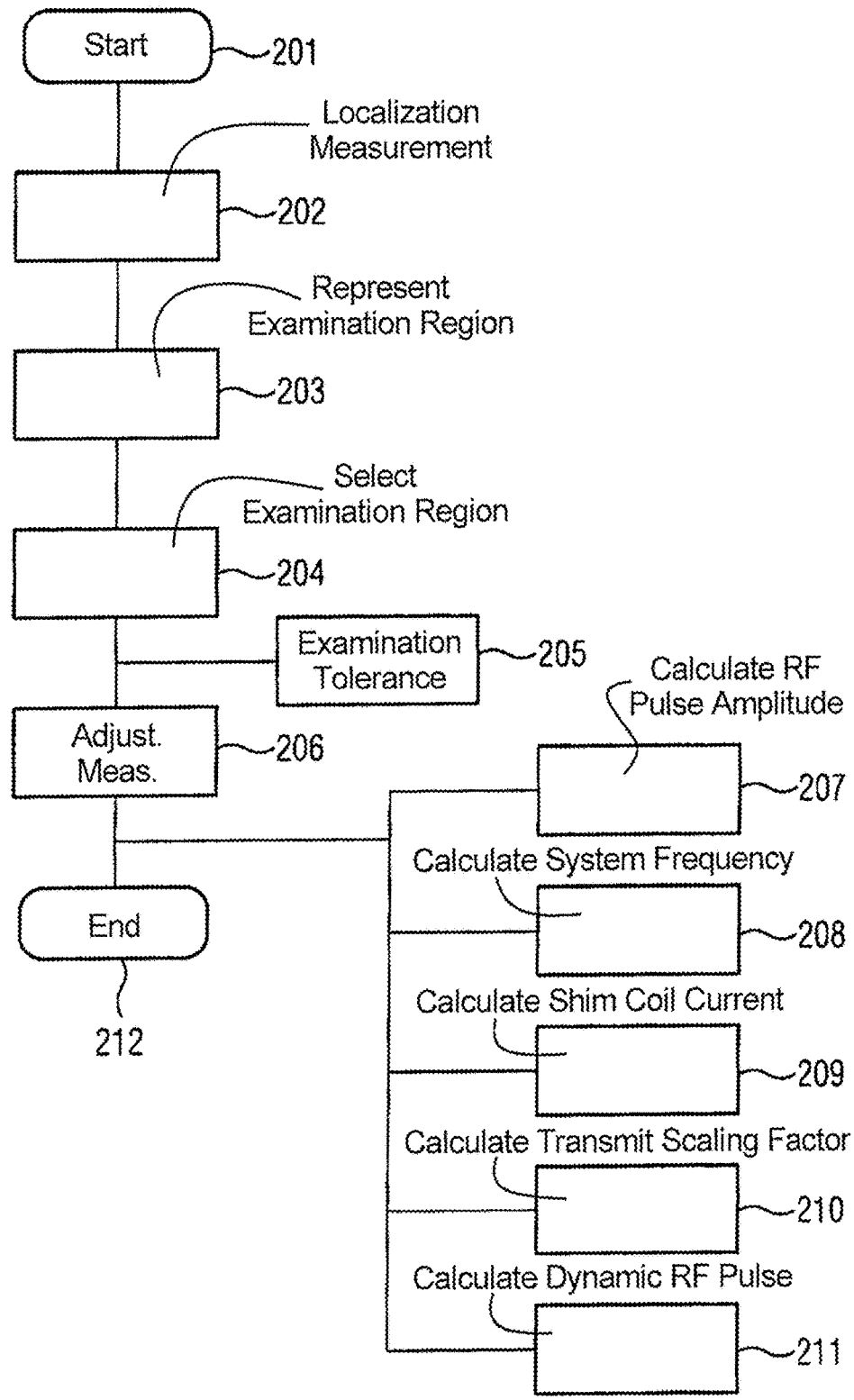

METHOD AND MAGNETIC RESONANCE APPARATUS FOR PERFORMING AN ADJUSTING MEASUREMENT

BACKGROUND OF THE INVENTION

Field of the Invention

The present invention concerns a method for performing at least one adjusting measurement in a magnetic resonance (MR) device, as well as a correspondingly configured MR apparatus and a non-transitory computer-readable storage medium for implementing such a method.

Description of the Prior Art

To create a magnetic resonance image for detecting magnetic resonance signals in a magnetic resonance apparatus, system parameters such as resonant frequency, a transmitter reference amplitude or the polarization field B0 have to be matched to the examination object in order to be able to obtain informative magnetic resonance images of the examination object. An independent adjustment step is executed in each instance to determine the parameters for said system components. It generally consists of a specific independent measurement and an evaluation for this.

Such so-called adjusting measurements generally take place before each examination using a magnetic resonance device and are intended to optimize system-specific settings for the object to be examined.

In some instances the region that is of interest from a medical point of view is sometimes only a small part of the entire measuring volume. This is the case for example when a number of transverse slices are recorded in the abdomen but for example only the liver or pancreas is of relevance for a medical diagnosis. However as the surrounding regions are also within the examination volume, they are generally also included in the adjusting measurements for the system-specific parameters.

As the magnetic fields (B0 and B1) in the human body are subject to significant variations, it is often the case that the determined values represent an optimum choice on average over the entire measuring volume but they are less optimal for the medically relevant region.

SUMMARY OF THE INVENTION

An object of the present invention is to provide a method for performing at least one adjusting measurement, which is optimized for a volume of a medically relevant region.

The above object is achieved in accordance with the invention by a method for performing at least one adjusting measurement in a magnetic resonance device is provided, performing a localizing measurement using the magnetic resonance device and creating a localization dataset, representing at least one examination region on the localization dataset, selecting at least one examination region of the localization dataset, and performing at least one adjusting measurement according to the at least one selected examination region.

As used herein, a localizing measurement using the magnetic resonance apparatus means a measurement that is usually performed before the actual diagnostic imaging magnetic resonance measurement (data acquisition), which allows the user to select examination regions for the subsequent imaging measurements. With such measurements, which are also referred to as scout or localizer measurements, automatic algorithms can be used, which segment specified organs such as the liver automatically, and represent them in a localization dataset.

Such automatic segmentation allows at least one examination region to be represented on the localization dataset. This dispenses with the need for a time-consuming and technical knowledge-based manual determination of the examination region. At least one examination region is then selected.

At least one adjusting measurement can be performed according to the at least one selected examination region.

Such optimization of the adjusting measurement for a volume of a medically relevant region means that the system-specific parameters are determined specifically in said region and a better image quality can also be achieved.

In an embodiment, the at least one adjusting measurement comprises the calculation of a radio-frequency pulse amplitude. It is thus possible to achieve a desired excitation angle for a defined pulse form and pulse duration, thereby also improving image quality.

In a further embodiment, the at least one adjusting measurement comprises the calculation of a system frequency. This corresponds to the mean resonant frequency of the nuclear spins present during the examination and bound in water. This also improves image quality when the system frequency is matched to the examination volume.

In another embodiment, the at least one adjusting measurement comprises the calculation of at least one current of at least one shim coil. This is used to obtain the most homogenous static magnetic field possible, the B0 field, which also in turn has a positive effect on image quality.

In another embodiment, the at least one adjusting measurement comprises the calculation of transmit scaling factors. These are used for transmit elements in a multichannel transmit mode, also known as B1 shimming, in order to produce the most homogeneous distribution possible of the RF transmit field, in other words of the B1 field, in the examination region, which in turn again has a positive effect on image quality.

In a further embodiment, the at least one examination region comprises an examination tolerance. An examination tolerance here refers to a region of defined size extending beyond the selected examination region of the localization dataset, in order to allow a certain error tolerance for the automatic segmentation, and at the same time to capture the direct vicinity of the examination region, which may nevertheless be advantageous for the medical examination.

In another embodiment, the at least one adjusting measurement includes the calculation of dynamic radio-frequency pulses. These are determined in order to obtain a desired distribution of the excitation angle as accurately as possible within a defined target volume. This also helps to improve image quality.

The present invention also encompasses a magnetic resonance apparatus that is designed to perform at least one adjusting measurement in accordance with the invention.

The magnetic resonance device according to the invention has an adjusting unit and a processing unit and is configured to perform a localizing measurement using the magnetic resonance device and creating a localization dataset using the processing unit, represent at least one examination region on the localization dataset using the processing unit, select at least one examination region of the localization dataset using the processing unit, and perform at least one adjusting measurement according to the at least one selected examination region using the adjusting unit.

The present invention also encompasses a non-transitory, computer-readable data storage medium encoded with programming instructions, which can be loaded into a programmable controller or computer of a magnetic resonance apparatus. The programming instructions cause all or various embodiments of the inventive method to be executed when executed by the controller or control computer of the magnetic resonance apparatus. The programming instructions may require program means, e.g. libraries and auxiliary functions, to implement the embodiments of the method. The programming instructions can be a source code, which has yet to be compiled and linked or which only has to be interpreted, or an executable software code, which only has to be loaded into the corresponding computation unit to be executed.

The electronically readable storage medium can be, for example, a DVD, magnetic tape or USB stick, on which electronically readable control information, in particular software, is stored.

The advantages of the inventive magnetic resonance apparatus, and the inventive electronically readable storage medium correspond essentially to the advantages of the inventive method, as described in detail above. Features, advantages or alternative embodiments of the method can be applied equally to the apparatus and storage medium and vice versa. The object of the magnetic resonance device can be developed with the features that are described in relation to a method. The functional features of the method are formed by suitable modules in object form, in particular by hardware modules.

BRIEF DESCRIPTION OF THE DRAWINGS

FIG. 2 is a flowchart of the inventive method.

DESCRIPTION OF THE PREFERRED EMBODIMENTS

Figure 1:
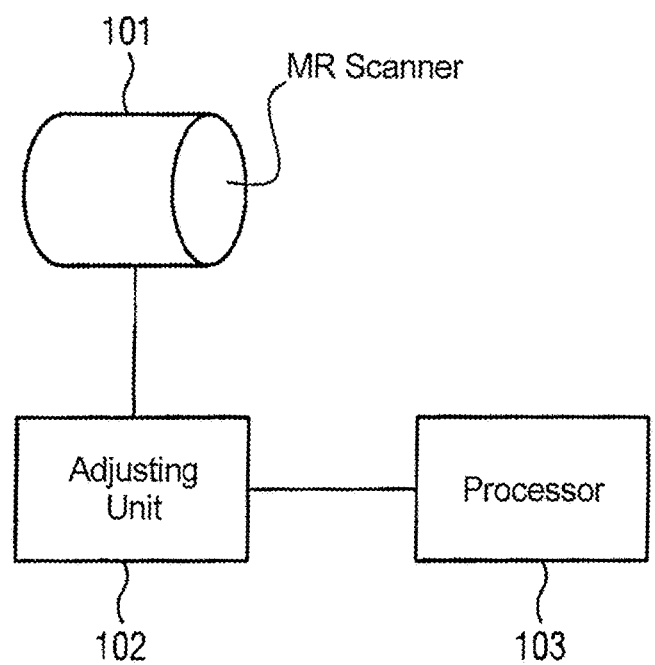
FIG. 1 shows an inventive magnetic resonance device.

FIG. 1 shows an inventive magnetic resonance apparatus that has an MR scanner 101. The magnetic resonance scanner 101 is connected to an adjusting unit 102 and a processor 103 and is configured to perform at least one adjusting measurement.

The magnetic resonance scanner 101 is embodied as a basic magnetic resonance scanner 101. Alternatively the magnetic resonance scanner 101 can be combined with positron emission tomography equipment.

FIG. 2 is a flowchart of the inventive method. The method comprises the method steps 201 to 212, with parts of the description including the corresponding reference characters introduced in conjunction with FIG. 1 also being used in the description of the method steps 201 to 212.

The first method step 201, represents the start of performance of at least one adjusting measurement in a magnetic resonance scanner 101.

In method step 202, a localization (scout) measurement (MR data acquisition) is performed using the magnetic resonance scanner 101 and a localization dataset is created. The performance of the localizing measurement and the creation of the localization dataset preferably take place automatically.

In a method step 203, at least one examination region is represented (identified) in on the localization dataset using the processing unit 103. This representation also preferably takes place automatically.

In method step 204, at least one examination region of the localization dataset is selected using the processing unit 103.

Method step 205 is an optional method step, wherein the selection of at least one examination region of the localization dataset is made, wherein the examination region has an examination tolerance. An examination tolerance here refers to a region of defined size extending beyond the selected examination region of the localization dataset, in order to allow a certain error tolerance for the automatic segmentation and at the same time capturing the direct vicinity of the examination region, which may nevertheless be advantageous for the medical examination.

In a method step 206 performance of at least one adjusting measurement according to the at least one selected examination region is implemented using the adjusting unit 103. Such optimization of the adjusting measurement for a volume of a medically relevant region means that the system-specific parameters are determined specifically in that region and a better image quality can also be achieved.

In a method step 207, a radio-frequency pulse amplitude is calculated during the adjusting measurement using the adjusting unit 103. It is thus possible to achieve a desired excitation angle (flip angle) for a defined pulse form and pulse duration.

In method step 208, a system frequency is calculated during the adjusting measurement using the adjusting unit 103. This corresponds to the mean resonant frequency of the nuclear spins present during the examination and bound in water.

In a method step 209, the calculation of at least one current of at least one shim coil during the adjusting measurement using the adjusting unit 103 takes place. This is used to obtain the most homogeneous static magnetic field possible, the B0 field.

In a method step 210, a calculation of transmit scaling factors during the adjusting measurement using the adjusting unit 103 takes place. These are used for transmit elements in a multichannel transmit mode, also known as B1 shimming, in order to produce the most homogeneous distribution possible of the RF transmit field, in other words of the B1 field, in the examination region.

In a method step 211, dynamic radio-frequency pulses are calculated during the adjusting measurement using the adjusting unit 103. These are determined in order to obtain a desired distribution of the excitation angle as accurately as possible within a defined target volume.

During the execution of the inventive method the method steps 207 to 211 can be used as alternatives or they can be combined with one another in any manner.

A last method step 212 represents the end of the performance of at least one adjusting measurement in a magnetic resonance scanner 101.

In summary, the invention concerns a method for performing at least one adjusting measurement in a magnetic resonance device, that includes performing a localizing measurement using the magnetic resonance device and creating a localization dataset, representing at least one examination region on the localization dataset, selecting at least one examination region of the localization dataset, and performing at least one adjusting measurement according to the at least one selected examination region.

In an embodiment, the at least one adjusting measurement comprises the calculation of a radio-frequency pulse amplitude, the calculation of a system frequency and the calculation of at least one current of at least one shim coil.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance (MR) apparatus having an MR scanner, said method comprising:
   prior to operating the MR scanner in a scan to obtain a diagnostic MR dataset, operating the MR seamier, while an examination subject is situated therein, to perform a localizing MR measurement of the subject, thereby obtaining a localization MR dataset of a region of the subject;
   in a processor provided with said MR localization dataset, identifying at least one examination region of the subject within said MR localization dataset that is smaller than the total region of said localization MR dataset;
   in said processor, selecting an identified examination region from the MR localization dataset as a selected examination region; and
   in said processor, determining at least one adjusting parameter, restricted to said selected examination region, and making said adjusting parameter available as an electronic signal at an output of the processor in a form for operating said MR scanner in an adjusting measurement of the subject, using said adjusting parameter, to acquire MR data from said selected examination region, and using the MR data acquired in said adjusting measurement to set at least one parameter for operating said MR scanner in said scan to obtain said diagnostic MR dataset.

2. A method as claimed in claim 1 wherein said adjusting measurement comprises radiation of at least one radio-frequency pulse having a pulse amplitude, and wherein determining said adjusting parameter comprises calculating said pulse amplitude of said radio-frequency pulse.

3. A method as claimed in claim 1 wherein said MR scanner is operated in said adjusting measurement at a system frequency, and wherein determining said adjusting parameter comprises calculating said system frequency.

4. A method as claimed in claim 1 wherein said adjusting measurement includes shimming a basic magnetic field of said MR scanner using at least one shim coil supplied with current, and wherein determining said adjusting parameter comprises calculating said current of said at least one shim coil.

5. A method as claimed in claim 1 wherein said adjusting measurement includes radiation of at least one radio-frequency pulse according to a transmission scaling factor, and wherein determining said adjusting parameter comprises calculating said at least one transmission scaling factor.

6. A method as claimed in claim 1 wherein said adjusting measurement has an examination tolerance associated therewith, and wherein determining said adjusting parameter comprises determining said examination tolerance.

7. A method as claimed in claim 1 wherein said adjusting measurement includes radiation of dynamic radio-frequency pulses, and wherein determining said adjusting parameter comprises calculating a configuration of said dynamic radio-frequency pulses.

8. A magnetic resonance (MR) apparatus comprising:
   an MR scanner;
   a control computer configured to operate the MR scanner prior to operating the MR scanner in a scan to obtain a diagnostic MR dataset, while an examination subject is situated therein, to perform a localizing MR measurement of the subject, thereby obtaining a localization MR dataset of a region of the subject;
   a processor provided with said MR localization dataset, said processor being configured to identify at least one examination region of the subject within said MR localization dataset that is smaller than the total region of said localization MR dataset;
   said processor being configured to select an identified examination region from the MR localization dataset as a selected examination region; and
   said processor being configured to determine at least one adjusting parameter, restricted to said selected examination region, and to make said adjusting parameter available as an electronic signal at an output of the processor in a form for operating said MR scanner in an adjusting measurement of the subject, using said adjusting parameter, to acquire MR data from said selected examination region, and to use the MR data acquired in said adjusting measurement to set at least one parameter for operating said MR scanner in said scan to obtain said diagnostic MR dataset.

9. A non-transitory, computer-readable data storage medium encoded with programming instructions, said storage medium being loaded into a computer system of a magnetic resonance (MR) apparatus that also comprises an MR scanner, said programming instructions causing said computer system to:
   operate the MR scanner, while an examination subject is situated therein, to perform a localizing MR measurement of the subject prior to operating the MR scanner in a scan to obtain a diagnostic MR dataset, thereby obtaining a localization MR dataset of a region of the subject;
   identify at least one examination region of the subject within said MR localization dataset that is smaller than the total region of said localization MR dataset;
   select an identified examination region from the MR localization dataset as a selected examination region; and
   determine at least one adjusting parameter, restricted to said selected examination region, and make said adjusting parameter available as an electronic signal at an output of the computer system in a form for operating said MR scanner in an adjusting measurement of the subject, using said adjusting parameter, to acquire MR data from said selected examination region, and use the MR data acquired in said adjusting measurement to set at least one parameter for operating said MR scanner in said scan to obtain said diagnostic MR dataset.

* * * * *